US006967491B2

(12) United States Patent (10) Patent No.: US 6,967,491 B2
Perdu et al. (45) Date of Patent: Nov. 22, 2005

(54) SPATIAL AND TEMPORAL SELECTIVE LASER ASSISTED FAULT LOCALIZATION

(75) Inventors: Philippe Perdu, Toulouse (FR); Romain Desplats, Toulouse (FR); Felix Beaudoin, Toulouse (FR); Praveen Vedagarbha, Fremont, CA (US); Martin Leibowitz, Fremont, CA (US); Kenneth R. Wilsher, Palo Alto, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/888,840

(22) Filed: Jul. 9, 2004

(65) Prior Publication Data

US 2005/0006602 A1 Jan. 13, 2005

Related U.S. Application Data

(60) Provisional application No. 60/486,490, filed on Jul. 11, 2003.

(51) Int. Cl.[7] .......................................... G01R 31/302
(52) U.S. Cl. ..................................... 324/752; 324/750
(58) Field of Search ........................ 324/96, 750, 751, 324/765; 250/310, 311

(56) References Cited

U.S. PATENT DOCUMENTS 5,270,643 A * 12/1993 Richardson et al. ......... 324/751
5,430,305 A    7/1995 Cole, Jr. et al. .......... 250/559.07
5,451,863 A * 9/1995 Freeman ....................... 324/96
5,804,980 A    9/1998 Nikawa ....................... 324/752
6,078,183 A    6/2000 Cole, Jr. ...................... 324/752
6,137,304 A * 10/2000 Nikawa ....................... 324/765
6,483,326 B1  11/2002 Bruce et al. ................. 324/751
6,546,513 B1   4/2003 Wilcox et al. ............... 714/738
6,549,022 B1   4/2003 Cole, Jr. et al. ............ 324/752

OTHER PUBLICATIONS

Bruce et al., "Soft Defect Localization (SDL) on ICs", Proceedings From the 28th International Symposium for Testing and Failure Analysis (ISTFA), pp. 21-27, Nov. 3-7, 2002.

Bruce et al., "Soft Defect Localization (SDL) on ICs", Proceedings From the 28th International Symposium for Testing and Failure Analysis (ISTFA), pp. 21-27, Nov. 3-7, 2002.

Rowlette et al., Critical Timing Analysis in Microprocessors Using Near-IR Laser Assisted Device Alteration (LADA), ITC International Test Conference, pp. 264-273, 2003, no month.

* cited by examiner

*Primary Examiner*—Vinh Nguyen
*Assistant Examiner*—Russell M. Kobert
(74) *Attorney, Agent, or Firm*—Dorsey & Whitney LLP

(57) ABSTRACT

A method and apparatus for laser-assisted fault mapping which synchronizes the laser control with the tester unit. The inventive method provides for laser-assisted pseudo-static fault mapping to localize defects in a device whose inputs are being stimulated dynamically by a tester. It further provides for laser-assisted dynamic soft error mapping, to localize in terms of location and to correlate with respect to a specific test vector, sensitive areas in a device by utilizing device performance criteria such as pass-fail status outputs. The apparatus includes a fully controllable dynamic laser stimulation apparatus connected to a control unit that provides complete synchronization with a tester unit.

48 Claims, 5 Drawing Sheets

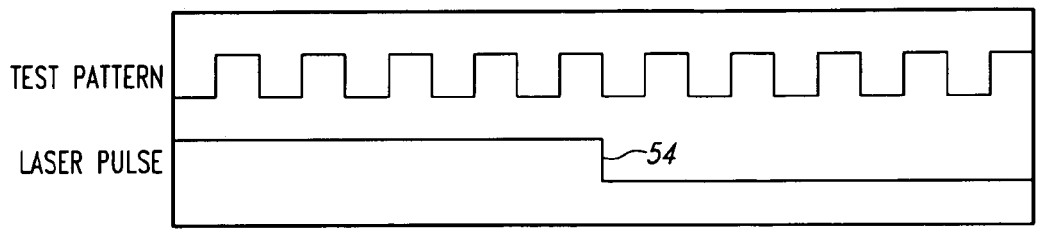
*Fig. 5D(1)*  RESULT = FAIL
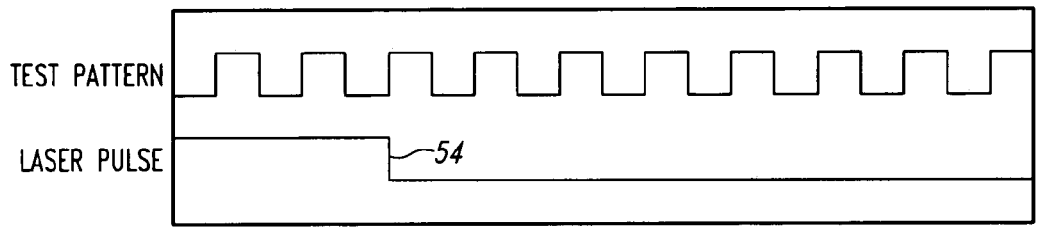
*Fig. 5D(2)*  RESULT = PASS
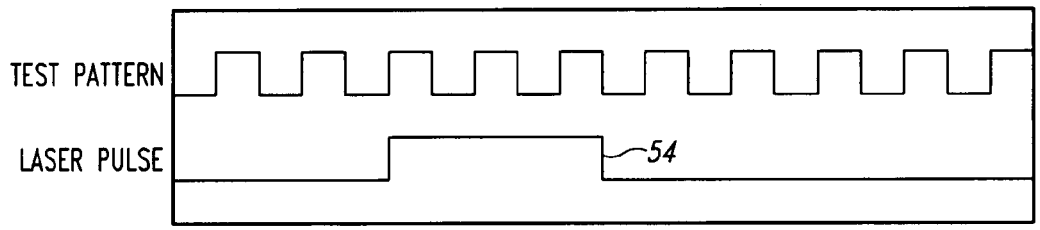
*Fig. 5D(3)*  RESULT = FAIL
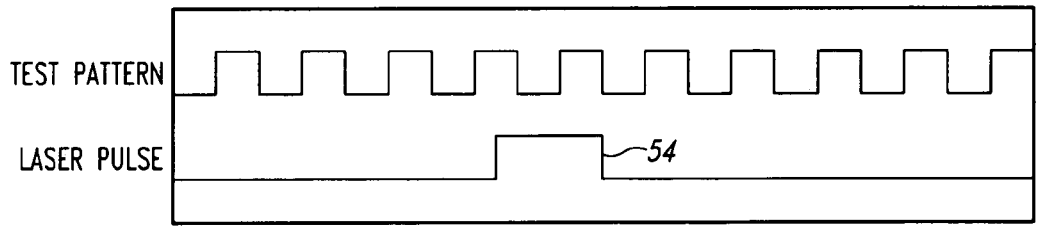
*Fig. 5D(4)*  RESULT = FAIL
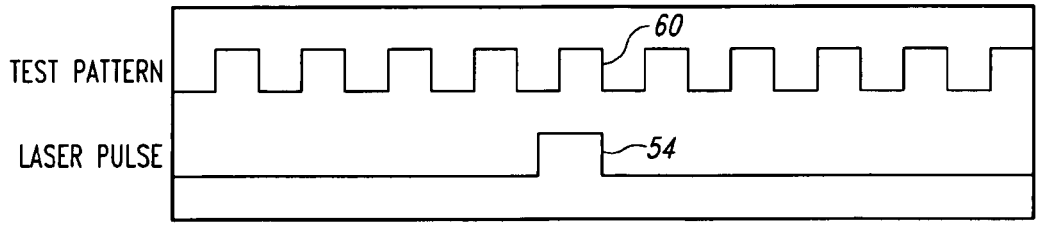
*Fig. 5D(5)*  RESULT = FAIL

SPATIAL AND TEMPORAL SELECTIVE LASER ASSISTED FAULT LOCALIZATION

CROSS-REFERENCE TO RELATED APPLICATIONS

This application claims priority to U.S. Provisional Patent Application No. 60/486,490 titled "Spatial and Temporal Selective Laser Assisted Fault Localization," filed Jul. 11, 2003, which is hereby incorporated by reference herein.

FIELD OF THE INVENTION

Aspects of this invention relate to apparatus and methods of localization, identification, and mapping of faults, defects, or sensitive areas in integrated circuit devices, and in particular to the use of a laser synchronized with a tester to achieve such localization, identification, and mapping.

BACKGROUND OF THE INVENTION

As integrated circuits become smaller, denser, and faster, development of new methods for testing and debugging has become necessary. In particular, the localization of defects or sensitive areas in circuits, which may contribute to or cause operational failures, is a critical element in debug and failure analysis, as well as enabling circuit repairs with charged particle tools such as focused ion beam ("FIB") tools.

The use of lasers in the investigation of integrated circuit defects and sensitive areas is well known. When a laser beam impinges on a material such as a semiconductor substrate or metal interconnect, it can cause thermal effects and/or photo-generated charge carrier effects, both of which can be utilized to localize many types of circuit defects. Two methods, referred to as thermally induced voltage alteration ("TIVA") and optical beam induced resistance change ("OBRICH") were developed to utilize thermal effects for circuit defect analysis. Light induced voltage alteration ("LIVA") is a method developed to utilize photo-generated charge carrier effects for circuit defect analysis. The TIVA method is described in U.S. Pat. No. 6,078,183 titled "Thermally-Induced Voltage Alteration for Integrated Circuit Analysis," issued Jun. 20, 2000, the LIVA method is described in U.S. Pat. No. 5,430,305 titled "Light Induced Voltage Alteration for Integrated Circuit Analysis," issued on Jul. 4, 1995, and the OBIRCH method is described in U.S. Pat. No. 5,804,980 titled "Method and System Testing an Interconnection in a Semiconductor Integrated Circuit," issued on Sep. 8, 1998. These three patents are hereby incorporated by reference in their entireties.

In thermal laser stimulation, a laser beam, generally infrared, is scanned across the front side or backside of an integrated circuit at a constant rate in a raster pattern (i.e., a series of rows collectively defining a box) so as to locally heat the device under test ("DUT"), and to induce thermal gradients in such regions as the metal interconnects. A variety of measurements can be made, such as changes in voltage, current, power consumption, or resistivity as a result of the local heating caused by the beam. This facilitates localization of such defects as shorts, leakage sites, spikes, abnormal contacts or vias, and filaments, as well as sensitive areas which may include signal flow bottlenecks.

When a laser beam, generally visible or near-IR, and having a photon energy above the silicon band gap, impinges on a silicon substrate which may have an integrated circuit therein, a photo-generated charge carrier effect results. The laser beam energy is dissipated, in part, by generating electron-hole pairs in the silicon. In high-field regions such as transistor junctions, the electron-hole pairs dissociate, resulting in a measurable current generation. Measurement of this current can enable localization of defective junctions, and junctions connected to defects.

Prior methods of utilizing the aforementioned techniques to measure current or voltage variations or device parameter variations resulting from laser-induced heating or photo-generated charge carriers for defect mapping employ a laser source and a testing unit which is not synchronized with the laser source. The testing unit, such as an automatic test equipment ("ATE") device, applies a test pattern, typically in the form of a series of vectors or logical 1s and 0s to one or more input pins of a DUT, and collects the resulting output pattern from the DUT. The output pattern may be compared to an expected pattern to derive a pass/fail indicator. For a first example, in the prior method known as "static fault mapping", the DUT is held at a particular internal state by stopping the tester generating the test pattern at a certain vector of interest while a laser beam scans an area of the device and current or voltages are measured. Defects or sensitive areas are located by determining where large current or voltage changes are seen to be induced by the beam. However, devices such as dynamic logic devices generally cannot be held in a static state sufficiently long for the scanning and measurement to be completed.

For a second example, in the prior method known as "soft error mapping" or "soft defect localization," soft errors (i.e., test failures due to device or circuit errors, which can be induced by adjusting test parameters such as clock speed or power supply voltage), are located by scanning an area of a device with a continuous heating laser beam, or perhaps a current-inducing laser beam, while running a test pattern and observing the pass/fail signal from the device tester. As with the static fault mapping method, the laser source is not synchronized with the testing unit. To avoid ambiguities in the results, the dwell time of the laser beam at each XY position (pixel) in the raster scan pattern is generally set to be at least as long as the time for a complete test pattern to run. Although the XY location of the current elements causing the soft error can be located using this method, the actual test vector or vectors exercising the soft error are not identified. Descriptions of the soft-defect localization method are found in a paper titled "Soft Defect Localization (SDL) on ICs" by Michael R. Bruce et al., Proceedings from the 28th International Symposium for Testing and Failure Analysis, 3–7 Nov. 2002, Phoenix, Ariz.; U.S. Pat. No. 6,549,022 titled "Apparatus and Method for Analyzing Functional Failure in Integrated Circuits," issued Apr. 15, 2003; and U.S. Pat. No. 6,483,326 titled "Localized Heating for Defect Isolation During Die Operation," issued Nov. 19, 2002, all of which are hereby incorporated by reference in their entireties.

The utility of laser-enhanced defect- and fault-, sensitive area- or error-mapping would be greatly enhanced by an apparatus and method enabling the use of synchronous timing of the laser with respect to the test pattern, as a controlled variable.

SUMMARY OF THE INVENTION

In light of the background information set forth above, aspects of the present invention provide a method and apparatus for laser-assisted fault mapping which synchronizes a laser with the test pattern. Aspects of the present invention further provide a method and apparatus for laser-assisted "pseudo-static fault mapping" to localize defects or sensitive areas in a dynamic logic device. Aspects of the present invention also provide a method and apparatus for laser-assisted dynamic soft error mapping, to localize in XY position and to correlate with respect to a specific test vector, sensitive areas in a device by utilizing device performance criteria such as the pass-fail status output of the tester.

These and other aspects of the invention are met, in whole or in part, through a controllable laser stimulation apparatus connected to a control unit that provides synchronization with a tester unit, conforming to aspects of the invention.

BRIEF DESCRIPTION OF THE DRAWINGS

FIG. 5d shows a timing diagram as in FIG. 5a wherein one or more laser pulses or modulations with varying durations and varying positions with respect to the test loop are utilized, in accordance with one method of the present invention.

DETAILED DESCRIPTION OF THE INVENTION

Embodiments conforming to the aspects of the present invention involve a control unit arranged to synchronize a laser stimulation apparatus with a tester unit. Embodiments of the invention enable both the measurement of dynamic current or voltage variations, and measurement of dynamic device parameter variations, as described herein.

The laser may be controlled so as to have the laser beam impinge on the sample at particular times in the following ways: 1) it may be pulsed on and off, for example by beam blanking or by switching, or 2) it may be modulated in intensity in an analog fashion, generally but not necessarily with a steep transition slope so as to approximate on/off switching. For the purposes of this disclosure, the act of modulating or pulsing the laser will be interchangeably defined as "temporally outputting" the laser, and the period when the laser is incident on the sample, e.g. the pulse period, will be interchangeably defined as the "impingement".

Figure 1:
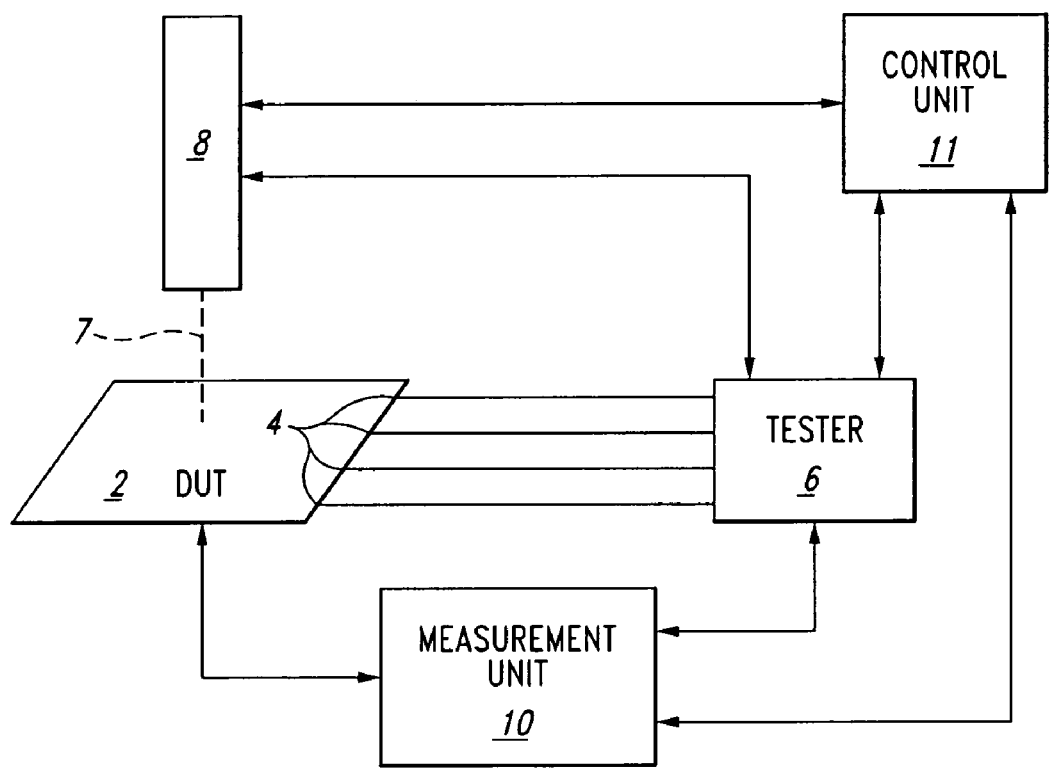
FIG. 1 shows a functional overview of one implementation of a tester and laser coordinated and synchronized with a control unit, in accordance with one embodiment of the present invention.

FIG. 1 shows a functional overview of the apparatus of the present invention. the device under test ("DUT") 2, generally an integrated circuit or portion thereof, has inputs 4 connected to tester 6. Beam 7 from pulsed or modulated laser 8 impinges on DUT 2, and is also synchronized with tester 6. Measurement system 10 may measure current or voltage from DUT, or it may indicate, log or store the DUT pass/fail status obtained from tester 6. Control unit 11 provides communication with and between the different sub-systems of the apparatus. For measurement of dynamic current or voltage variations, i.e. as applied to pseudo-static fault mapping, the tester controls the inputs of a DUT. In one embodiment, the laser beam is synchronously pulsed or modulated to stimulate a location on the DUT only during the time interval when the tester applies a particular test vector (i.e., set of tester outputs applied to the device inputs) of interest. The current or voltage variation is measured, generally at output pins of the DUT, during the period when the laser beam is incident and the tester outputs are not changing. This process is repeated for a series of XY locations on the DUT, and may be limited to particular areas of interest on the DUT. A contrast map of measured current or voltage variation may then be generated, which can show XY locations on the DUT where large variations occurred. These locations correspond to suspected defect locations. The programming of the laser pulsing or modulation to be synchronized with a particular test vector provides additional information about the defect type and characteristics.

For measurement of a dynamic device parameter i.e., device switching parameter) variations, i.e., as applied to dynamic soft-error mapping, the tester controls the inputs of a DUT, and further monitors its outputs. In one embodiment, the laser is synchronously pulsed or modulated to stimulate a location on the DUT only during the time interval when the tester applies a particular test vector or set of test vectors of interest. This process is repeated for a series of XY locations on the DUT, and may be limited to particular areas of interest on the DUT. The pass/fail result from each location is obtained from the tester and used to generate a pass/fail map, to show XY locations on the DUT where the pass/fail status changed as a result of laser stimulation. These locations correspond to sensitive areas where the laser impingement has altered some local parameter of the DUT, sufficiently to cause a change in pass/fail status. The programming of the laser impingement synchronized with a particular test vector or vectors provides additional information about the defect type or characteristics.

Description of the Apparatus

Figure 2:
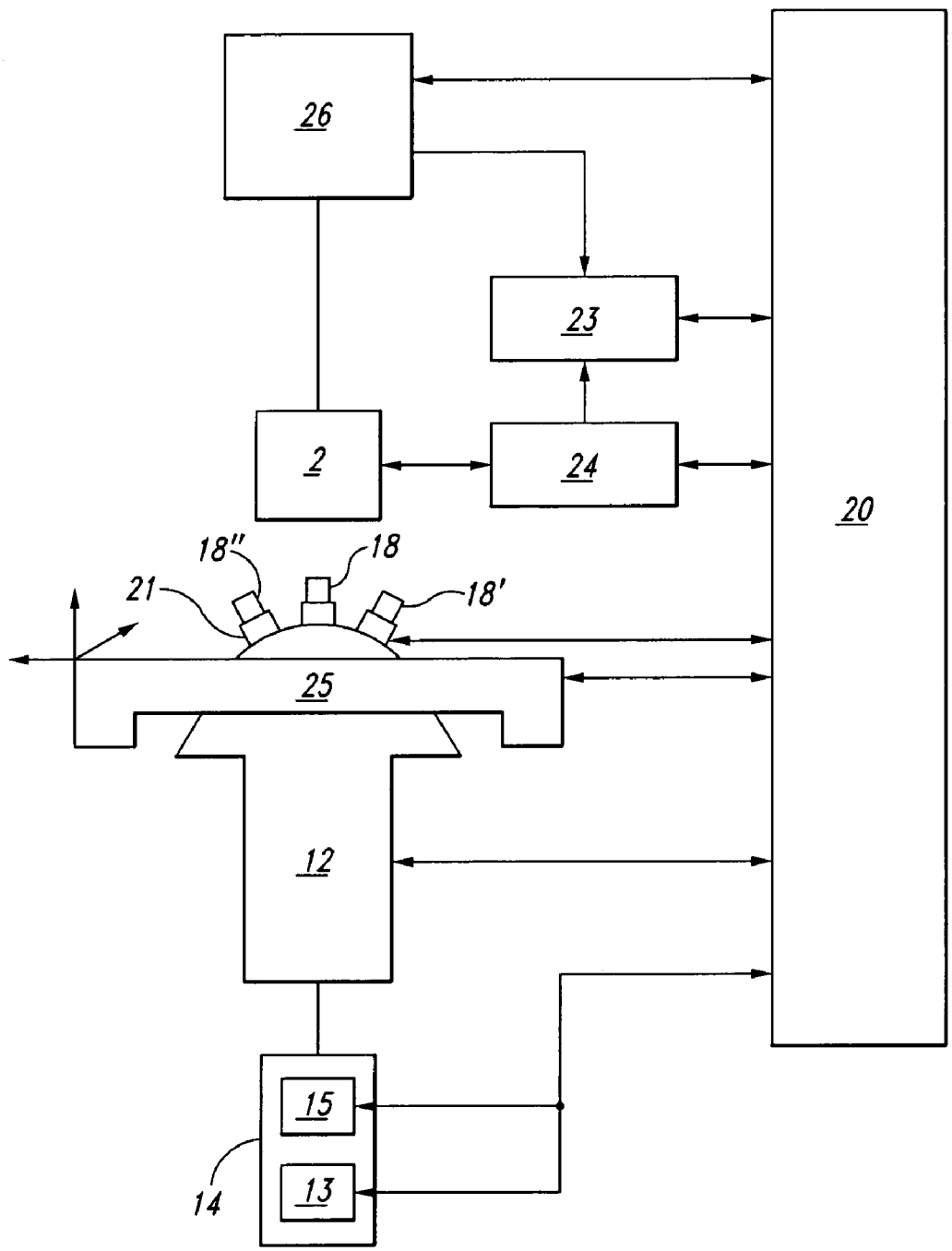
FIG. 2 shows a block diagram of an additional configuration conforming to the present invention.

One preferred embodiment of the inventive apparatus is shown as a functional diagram in FIG. 2. It is understood that modifications to the details of the apparatus may be made without departing from the inventive concept.

Scanning Optical Microscope (SOM) 12 houses a motorized dual mirror arrangement that allows raster scanning of the DUT. The SOM includes a laser input port to bring in the laser through a fiber optic cable from laser unit 14. A portion of the input laser is diverted and fed into a photodetector for power measurement purposes. The electrical output from the photo detector is then conditioned to yield an equivalent laser power signal that can be read into controller 20. The reflected laser coming back from the DUT via optical lens 18 is also fed into a photo detector. The output from the photodetector is conditioned and fed to an imaging card as a raw video input. The synchronization signals required to form a composite video signal corresponding to the reflected image comes from control unit 20. The reflected image of the DUT is used for navigational purposes and also as the background for overlay images. The SOM can scan the DUT both in the X and Y directions. The scan speed can be selected from a range between a fraction of a second per frame to several thousand seconds per frame. The scan resolution can range between 128×128 pixels to 1024×1024 pixels or higher. The optical zoom levels can range between 0.5× to 15× or higher. All of the scan control parameters can be adjusted from the control unit.

A selection of near-infrared objective lenses 18, 18', 18", etc., provides images at different magnifications. A turret assembly 21 allows for software selection of the lenses. The highest magnification lenses are installed on a motorized single axis stage assembly which allows for ultra-fine focus adjustment by providing fine control of the distance between the lens and the device. Optionally, longer working distance lenses may be installed on the turret assembly to help image device surfaces that are in deep cavities or devices mounted inside of sockets.

Laser unit 14 houses a laser source 13 which may include a thermal laser stimulation ("TLS") type laser ($\lambda$=1340 nm), a photoelectric laser stimulation ("PLS") type laser ($\lambda$=1064 nm), and a diode laser ($\lambda$=1064 nm) for navigational purposes. A software controlled optical switch mechanism inside the laser unit is used to select one of the three lasers. The laser unit can operate in any of the following modes: continuous-wave, chopped, pulsed/modulated-asynchronous, or pulsed/modulated-synchronous. The laser unit is also equipped with beam control 15 to control the pulse or modulation width and the output power of the laser.

Measurement unit 24 houses: a constant current source, a constant voltage source, a current amplifier, a voltage amplifier, and a pass/fail input conditioner. The current source can supply constant currents ranging from a few micro amps to several hundred milliamps. Signal conditioning unit 23 receives input from the tester 26 and the measurement unit 24 and modifies the input to be compatible with the control unit 20.

Stage assembly unit 25 provides for three-dimensional motion of the SOM 12 with respect to the DUT 2. The resolution of the stage in X, Y, and Z directions is 0.1 microns. The X and Y axes have a 4 inch travel range and the Z axis has an 0.6 inch travel range. The entire stage is mounted on air legs for vibration isolation. The stage moves the SOM and the turret assembly 21 relative to a stationary device.

Control unit 20 provides communication with and between the different sub-systems of the apparatus. The control unit is responsible for synchronizing the various components. It is further responsible for interpreting the high level commands from the user and converting them into system level commands, which are then used to control the individual sub-systems.

In one embodiment, the control unit may be implemented in a desktop/industrial PC with appropriate interface cards installed in the back plane. In one particular embodiment, the control unit may include a waveform and function generator card, such as a National Instruments™ N154XX series PCI based arbitrary waveform and function card configured to receive a trigger signal from the test unit 6. Upon receipt of the trigger signal, synchronized with the start or same portion of the test pattern applied to the DUT, the card starts an asynchronous pixel clock or a modulating pulse in communication with the laser unit 8.

To provide the communication pathway with the laser unit 8, the control unit may include a serial/USB interface card, such as the RocketPort™ Multi Serial Interface Card ™. To provide the communication pathway with the SOM 12, the control unit may include a PCI/ISA type interface card employing an FPGA to generate the control signals as well as video synchronization signals for frame grabbers.

The control unit may also include a video frame grabber card, such as the Matrox Meter II™ PCI format card, to display reflected images from the DUT and measurements. Finally, the control unit may include a GPIB type communication card, such as the National Instruments™ PCI-GPIB™ card, to provide the communication to and control of the measurement unit(s) 10.

Tester unit 26, which may be any conventional ATE device, has its outputs connected to the inputs of the DUT. Additionally, the outputs of DUT may also be connected to the tester unit, depending on the type of test being conducted.

Description of the Methods

1. Dynamic Current or Voltage Variations (Laser-Assisted "Pseudo-Static Fault Mapping")

Figure 3:
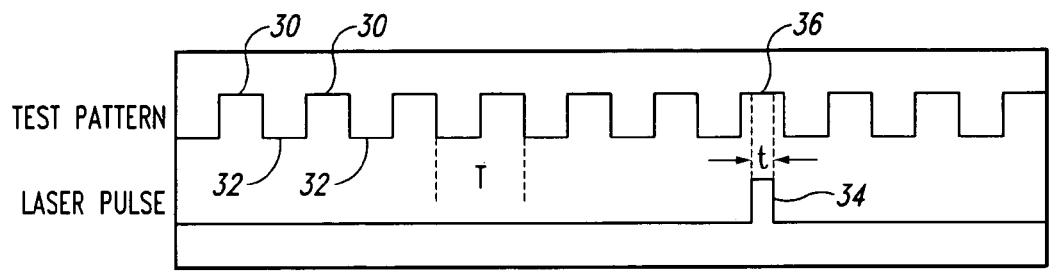
FIG. 3 shows a timing diagram illustrative of a method for Pseudo-Static Fault Mapping, in accordance with one method of the present invention.

FIG. 3 shows a timing diagram illustrative of a first embodiment of the inventive method. The tester applies a series of test vectors 30 ("on states") interspersed with "off states" 32, at a clock frequency f corresponding to a clock period T=1/f. Within the on portion of each clock period, the test vector is held in a steady state, i.e., the DUT 2 is held in a pseudo-static state according to the particular test vector applied. An apparatus or system conforming to the invention can time the incidence of a laser pulse or modulation to coincide with the steady-state time period of the test loop, at a particular test vector 30. The Figure shows laser pulse or modulation 34 applied for measurement period t, during the steady-state portion of test vector 36. The minimum measurement period t is dependent on the type of measurement being made and the physical effect being stimulated by the laser. By way of example, if thermally induced changes are being measured, the minimum t is approximately 10 microseconds, since simulation results have shown that thermal equilibrium in micrometric metal lines is reached in about 10 microseconds. Photo generated phenomena reach equilibrium much more quickly, about 1 nanosecond. If a current or voltage variation outside the DUT is being measured, the minimum t is approximately 1 microsecond. In the case, for example, that a photo generated phenomenon is being stimulated, but the measurement is of a current or voltage outside the DUT, the minimum t is the maximum of the two values, i.e., 1 microsecond. By scanning the laser across the region of interest, a mapping of suspected fault locations can be produced.

Figure 4A:
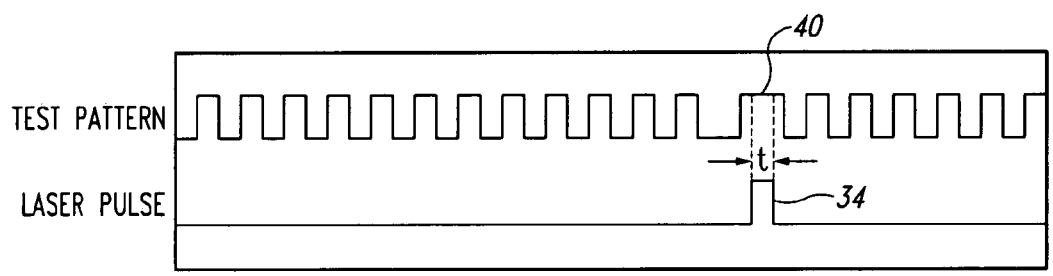
FIG. 4a shows a timing diagram as in FIG. 3 wherein the test period of selected test vectors during which a laser pulse or modulation is applied and measurements are made is varied, in accordance with one method of the present invention.
Figure 4B:
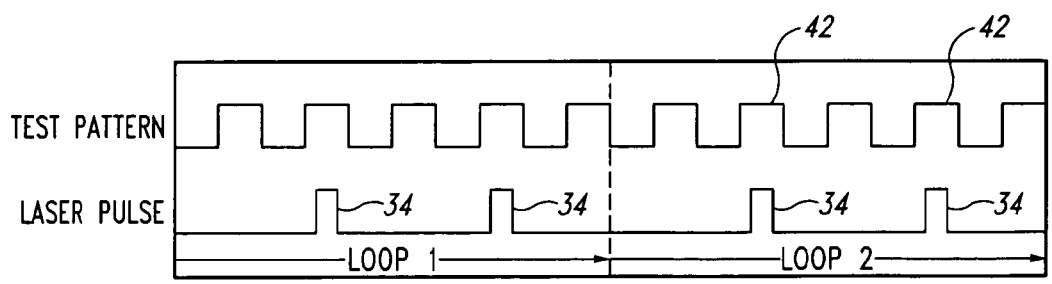
FIG. 4b shows a timing diagram as in FIG. 3 wherein laser pulses or modulations are applied and current or voltage measurements are made during multiple test vectors, in accordance with one method of the present invention.

The control and synchronization with the tester of the inventive dynamic laser stimulation apparatus provides the ability to vary the test pattern and/or to optimize the sequence of laser pulsing or modulation with respect to the test pattern. FIG. 4 illustrates two examples of such variation. In FIG. 4*a*, the test pattern is modified so as to vary the period of selected test vectors 40 during which laser pulse or modulation 34 is applied and measurements are made. In this way, the period T of all test vectors other than test vectors 40 can be shorter than the minimum measurement period t, thus reducing the necessary time to complete a test pattern. In FIG. 4b, laser pulses or modulations 34 are applied and current or voltage measurements are made during multiple test vectors 42, and may be repeated for successive loops of the test pattern at the same XY position during successive scans.

2. Laser-Induced Dynamic Device Parameter Variations

In the aforementioned method used for pseudo-static fault mapping, the laser pulse or modulation is applied during the steady-state time periods corresponding to particular test vectors. In contrast, in a method for laser-induced dynamic soft error mapping, a laser pulse or modulation may also be positioned (in time) during a vector transition of a test loop to induce device parameter variation. The tester not only controls the inputs of a DUT, but also monitors its outputs so as to measure device parameter variation and/or to determine the pass/fail result from each location. This yields a map of XY locations on the DUT where the device parameters or pass/fail status changed as a result of laser stimulation. Timing errors form a large portion of device or circuit errors, and they typically occur during vector transitions. Accordingly, stimulating a DUT with a laser beam during a specific transition inside the test pattern provides the sensitivity map of the DUT with respect to the transition.

FIG. 5 illustrates several possible embodiments of the inventive method which incorporate the temporal positioning of the laser pulse or modulation during vector transitions in the test loop and/or during steady-state periods of test vectors.

Figure 5A:
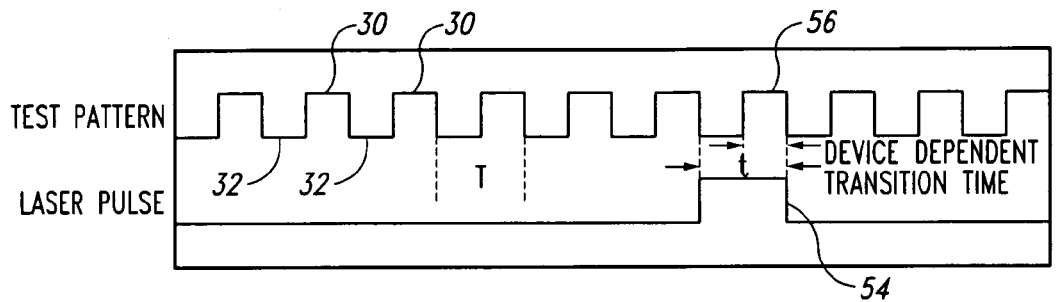
FIG. 5a shows a timing diagram illustrative of a method for Dynamic Soft Error Measurement which incorporates the positioning of the laser pulse or modulation during vector transitions in the test loop, in accordance with one method of the present invention.
Figure 5B:
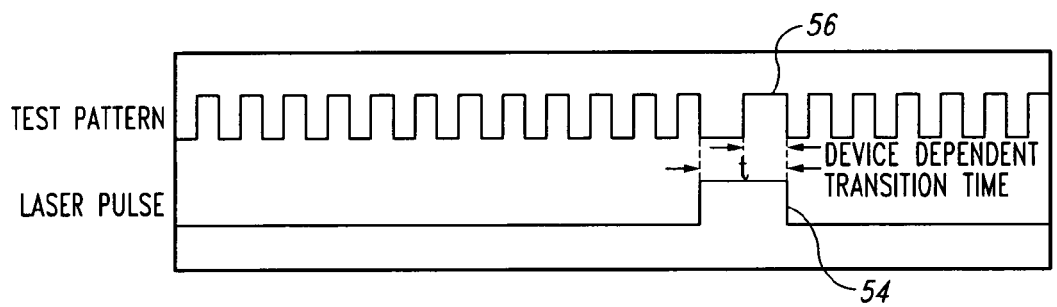
FIG. 5b shows a timing diagram as in FIG. 5a wherein the test period of selected test vectors during which a laser pulse or modulation is applied and device parameters and/or pass/fail status are determined is varied, in accordance with one method of the present invention.

FIG. 5a shows a timing diagram illustrative of an embodiment of the inventive method. The tester applies a series of test vectors 30 ("on states") interspersed with "off states" 32, at a clock frequency f corresponding to a clock period $T=1/f$. Within each clock period, a transition from an off state to an on state occurs according to the particular test vector applied. Apparatus and systems conforming to the invention can time the incidence of a laser pulse or modulation to overlap a transition at a particular test vector. FIGS. 5a and 5b show laser pulse or modulation 54 applied for period t, during the transition from the off state to the on state of test vector 56. The minimum period t is dependent on the physical effect being stimulated by the laser. By way of example, if thermally induced changes are being stimulated, the minimum t is approximately 10 microseconds, since simulation results have shown that thermal equilibrium in micrometric metal lines is reached in about 10 microseconds. Photo generated phenomena reach equilibrium much more quickly, about 1 nanosecond. By scanning the laser across the region of interest, a mapping of suspected fault locations can be produced.

Figure 5C:
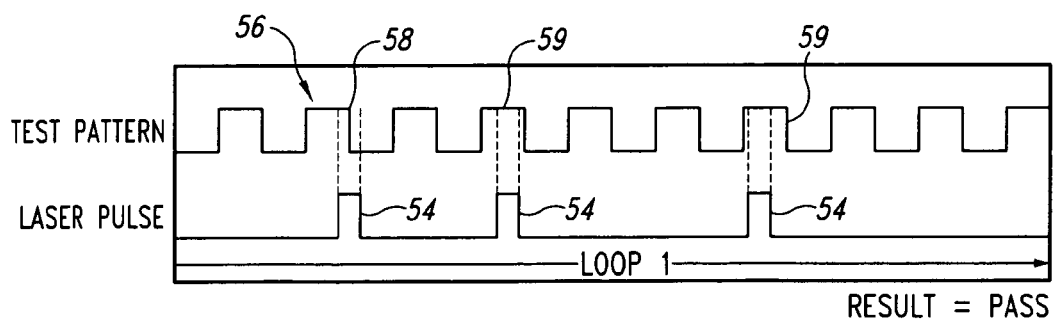
FIG. 5c shows a timing diagram as in FIG. 5a wherein laser pulses or modulations are applied and device parameter and/or pass/fail status determined during multiple test vectors, in accordance with one method of the present invention.

The control and synchronization with the tester of embodiments of the inventive dynamic laser stimulation apparatus provides the ability to vary the test pattern and/or to optimize the sequence of laser pulsing with respect to the test pattern. In FIG. 5b, the test pattern is modified so as to vary the test period of selected test vectors 56 during which laser pulse or modulation 54 is applied and device parameters and/or pass/fail status are determined. In this way, the period T of all test vectors other than test vectors 56 can be shorter than the minimum period t, thus reducing the necessary time to complete a test pattern. In FIG. 5c, laser pulses or modulations 54 are applied and device parameter and/or pass/fail status determined during multiple test vectors 56 including transition 58 and steady state portions 59, and may be repeated for successive loops of the test pattern at the same XY position during successive scans.

In FIG. 5d, the use of one or more laser pulses or modulations with varying durations and varying positions with respect to the test loop is shown. By applying the pulse or modulation for successively shorter portions of the test loop, such as in a binary search, according to the device parameter or pass/fail results, the test vector or vectors responsible for the failure can be identified in a minimum amount of time. By way of example, the laser can be applied during the entire test pattern to determine if a fault occurs. If so, then the laser is applied during half the test pattern to determine which half includes the fault (FIG. 5d (1)). In FIG. 5d(1) the laser pulse 54 is applied for half o the test pattern and the DUT fails the test. The period of the laser application can be halved for each to scan until the specific test vector responsible for the fault is located. In FIG. 5d(2) the laser pulse 54 is applied for the first half of the test pattern of FIG. 5d(1) and the DUT passes. Thus, the fault is isolated to the second half of the test pattern of FIG. 5d(1), as shown in FIG. 5d(3). As shown in FIG. 5d(4), to further isolate the fault, the laser pulse 54 is applied for half of the FIG. 5d(3) pattern, resulting in failure. To isolate the specific test vector 60 associated with the fault, the laser pulse 54 is applied only during that vector (FIG. 5d(5)), resulting in a failure.

The use of a dynamic laser stimulation apparatus with the capability of being synchronized with a tester unit enables a more complete characterization and mapping of heat- or photocurrent-induced faults or other effects. The test vector or vectors, or the transition or transitions which produce the fault can be determined as well as the location on the die where the fault occurs. This provides more information regarding the root cause of the fault, possibly enabling determination of the specific defect type. This in turn may facilitate improved and more efficient circuit repair.

It is understood that the invention is not restricted to the exact embodiments described herein. Modifications and changes to the apparatus and method may be made without departing from the inventive concept. By way of example:

1) any laser with wavelength between about 1 micron to several microns could be used for thermal effect generation, and any laser with a wavelength less than about 1 micron through the visible spectrum and below could be used for photo-generated charge carrier effects.

2) Different optical components or imaging components could be used other than those specifically disclosed.

3) The objective lens can focus the laser on the sample surface, just below the surface, or substantially (hundreds of microns) below the surface. The laser can illuminate either the frontside or the backside of the DUT.

4) For more rapid DUT sensitivity localization, a fast flood illumination source such as a strobe lamp in the visible range and with sufficient intensity, could be used to make an initial determination as to whether a DUT has any sensitivity response. If a response was indicated, a laser could then be used as described herein to provide better spatial resolution for localizing the sensitive region. An alternative method to achieve more rapid DUT sensitivity localization is to use the objective lens to defocus the laser beam initially to illuminate a much larger area of the DUT.

5) The laser can be scanned across the sample either by moving the sample relative to the beam using an XY stage, or by using an optical deflection system such as a Laser Scanning Microscope (LSM), e.g., from Checkpoint Technologies.

6) The laser could be a pulsed or modulated laser controlled (i.e. synchronized) by an external trigger signal. This could be in the form of an externally triggerable diode laser, or an integrated laser platform incorporating a continuous wave (CW) laser and an Electro Optical Modulator (EOM) to define a specific pulse or modulation width and time. Alternatively, a free running pulsed or modulated laser may be used in conjunction with an EOM.

7) The inventive method can be applied as well in an asynchronous mode in which the laser beam scan and test pattern are not locked to one another, under certain conditions such as if the laser scan is slower than the completion of a full test loop. When operating in an asynchronous mode, it is critical to determine the location of the laser when there is a failure in a particular vector in the test loop.

8) The tester does not necessarily have to be an ATE (Automated Test Environment). Any measurement which can be made externally to the DUT, such as frequency, phase, delay, can be utilized according to the inventive method.

Although various representative embodiments of this invention have been described above with a certain degree of particularity, those skilled in the art could make numerous alterations to the disclosed embodiments without departing from the spirit or scope of the inventive subject matter set forth in the specification and claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. In methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

We claim:

1. A method for synchronizing the directing of a laser impingement onto a semiconductor device with a test pattern executed on said device, said method comprising the steps of:
    providing a device to be tested, said device having test inputs for connecting a tester unit to said device, and further having device outputs for measuring current and voltage;
    providing a tester unit having tester outputs, said tester outputs being connected to said test inputs of said device and providing electrical signals to said test inputs of said device, said tester unit imposing a test pattern onto said test inputs of said device;
    providing a laser source arranged to produce a laser beam incident on said device, said laser source being controllable to output laser impingements at predetermined times; and
    temporally outputting said laser onto said device at predetermined times relative to said test pattern.

2. The method of claim 1 wherein said test pattern comprises at least one off state followed by at least one on state and a transition therebetween.

3. The method of claim 2 wherein the operation of temporally operating said laser at predetermine times relative to said test pattern comprises operating said laser during both said on state and said off state.

4. The method claim 2 wherein the operation of temporally operating said laser at predetermine times relative to said test pattern comprises outputting said laser during said transition.

5. The method of claim 2 wherein the operation of temporally outputting said laser at predetermine times relative to said test pattern comprises outputting said laser during said off state.

6. The method of claim 2 wherein the operation of temporally outputting said laser at predetermine times relative to said test pattern comprises outputting said laser during said on state.

7. The method of claim 6 wherein the operation of outputting said laser during said on state comprises outputting said laser during less than the entire time of the on state.

8. The method of claim 2 wherein the operation of temporally outputting said laser at predetermine times relative to said test pattern comprises outputting said laser during a time greater than the time of the off state and the on state.

9. A method for laser-assisted fault mapping on a semiconductor device comprising the steps of:
    providing a semiconductor device to be tested, said device having test inputs for connecting a tester unit to said device, and further having device outputs for measuring current and voltage;
    providing a tester unit having tester outputs, said tester outputs being connected to said test inputs of said device and providing electrical signals to said test inputs of said device, said tester unit imposing a test pattern onto said test inputs of said device, said test pattern comprising a series of "on state" test vectors interspersed with "off state" intervals, each said test vector plus the preceding "off state" interval comprising a corresponding test vector interval, said test vector intervals having a clock frequency f and a period T;
    providing a laser source arranged to produce a laser beam incident on said device, said laser source being controllable to output laser impingements at predetermined times;
    temporally outputting said laser to be incident onto said device at predetermined laser impingement intervals synchronized to said test pattern; and
    performing measurements on said device indicative of changes induced by said temporally outputting of said laser onto said device, to associate said changes with said synchronization of said laser impingement intervals to said test pattern.

10. The method of claim 9, wherein said step of temporally outputting said laser to be incident onto said device at predetermined laser impingement intervals synchronized to said test pattern includes providing a controller unit to synchronously control said tester unit and said laser source.

11. The method of claim 9, wherein said step of performing measurements on said device indicative of changes induced by said temporally outputting of said laser onto said device comprises measuring one selected from the group consisting of: current variation at said device outputs, and voltage variation at said device outputs, during said temporally outputting of said laser.

12. The method of claim 11, wherein the period T of said test vector intervals varies across said test pattern wherein test vector intervals not associated with measurements are shorter than test vector intervals associated with measurements.

13. The method of claim 11, wherein said step of temporally outputting said laser to be incident onto said device at predetermined laser impingement intervals synchronized to said test pattern comprises timing at least one said laser impingement interval to coincide with at least a portion of a particular predetermined test vector interval.

14. The method of claim 13, wherein said step of temporally outputting said laser to be incident onto said device at predetermined laser impingement intervals synchronized to said test pattern comprises temporally outputting said laser to provide a plurality of laser impingement intervals during a test pattern, and timing said laser impingement intervals such that at least a portion of each of a plurality of predetermined test vector intervals coincides with one of said plurality of laser impingement intervals.

15. The method of claim 11, further including the steps of:
scanning said laser across said device and performing said measurements at multiple locations across said device; and
generating a contrast map of said one selected from the group consisting of: current variation at said device outputs, and voltage variation at said device outputs, to yield suspected defect locations.

16. The method of claim 15, further including the step of determining which test vector is associated with the said one selected from the group consisting of: current variation at said device outputs, and voltage variation at said device outputs.

17. The method of claim 11, wherein said step of measuring one selected from the group consisting of: current variation at said device outputs, and voltage variation at said device outputs, is performed during a laser impingement interval when said laser beam is incident on said device and when said electrical signals provided by said tester outputs are not changing.

18. The method of claim 17, wherein said laser impingement interval coincides with an "on state" interval.

19. The method of claim 17, wherein said laser impingement interval comprises a measurement time t.

20. The method of claim 19, wherein said measurement is indicative of thermally induced phenomena, and wherein said measurement time t is at least 10 microseconds.

21. The method of claim 19, wherein said measurement is indicative of photogeneration phenomena, and wherein said measurement time t is at least 1 nanosecond.

22. The method of claim 21, wherein said measurement measures one selected from the group consisting of: current variation outside said device, and voltage variation outside said device, and wherein said measurement time t is at least 1 microsecond.

23. The method of claim 9, wherein said tester unit monitors test outputs from said device, and wherein said step of performing measurements on said device indicative of changes induced by said temporally outputting of said laser onto said device comprises performing device performance measurements.

24. The method of claim 23, wherein said step of performing device performance measurements comprises a step selected from the group consisting of: determining device pass-fail status, and measuring device parameter variation, during said temporally outputting of said laser.

25. The method of claim 24, wherein said step of temporally outputting said laser to be incident onto said device at predetermined laser impingement intervals synchronized to said test pattern comprises timing at least one said laser impingement to coincide with at least a portion of a particular predetermined test vector interval.

26. The method of claim 25, wherein said step of temporally outputting said laser to be incident onto said device at predetermined laser impingement intervals synchronized to said test pattern comprises temporally outputting said laser to provide a plurality of laser impingement intervals during a test pattern, and timing said laser impingement intervals such that at least a portion of each of a plurality of predetermined test vector intervals coincides with one of said plurality of laser impingement intervals.

27. The method of claim 25, further including the steps of:
scanning said laser across said device and performing said measurements at multiple locations across said device; and
generating a contrast map of said current variation to yield suspected defect locations.

28. The method of claim 25, wherein at least one said laser impingement interval overlaps a test vector transition between an "off" state and an "on" state.

29. The method of claim 28, wherein said laser impingement interval comprises a measurement time t.

30. The method of claim 29, wherein said measurement is indicative of thermally induced phenomena, and wherein said measurement time t is at least 10 microseconds.

31. The apparatus of claim 30, further including a Scanning Optical Microscope for directing said laser onto said device and for raster scanning of said device.

32. The method of claim 29, wherein said measurement is indicative of photogeneration phenomena, and wherein said measurement time t is at least 1 nanosecond.

33. The method of claim 28, wherein said laser impingement interval is halved for each successive test pattern, and wherein said laser impingement interval overlaps half of the portion of said test vector interval determined to include a device failure according to device performance measurements from the preceding test pattern.

34. The method of claim 25, wherein at least one said laser impingement interval coincides with an interval when said electrical signals provided by said tester outputs are not changing.

35. The method of claim 25, wherein said laser is temporally outputted over a series of test patterns, and wherein said overlap of said laser impingement intervals with said test vector intervals during each test pattern of said series of test patterns varies with respect to other test patterns in said series of test patterns.

36. The method of claim 35, wherein said laser impingement interval is shorter for each successive test pattern, and wherein the overlap of said laser impingement interval with said test vector intervals during each test pattern of said series of test patterns is determined according to device performance measurements from the preceding test pattern.

37. The method of claim 24, wherein the period T of said test vector intervals varies across said test pattern wherein test vector intervals not associated with measurements are shorter than test vector intervals associated with measurements.

38. An apparatus for laser-assisted fault mapping on a semiconductor device comprising:

a holder for holding a semiconductor device to be tested, said device having test inputs for connecting a tester unit to said device;

a tester unit having tester outputs for connecting to said test inputs of said device and providing electrical signals to said test inputs of said device, said tester unit imposing a test pattern onto said test inputs of said device, said test pattern comprising a series of "on state" test vectors interspersed with "off state" intervals, each said test vector plus the preceding "off state" interval comprising a corresponding test vector interval, said test vector intervals having a clock frequency f and a period T;

a laser source arranged to produce a laser beam incident on said device, said laser source being controllable to output laser impingements at predetermined times; and a controller unit to synchronously control said tester unit and said laser source.

39. The apparatus of claim 38, further including a measurement unit coupled to said device for measuring currents and voltages.

40. The apparatus of claim 39, wherein said measurement unit includes a constant current source, a constant voltage source, a current amplifier, a voltage amplifier, and a pass/fail input conditioner.

41. The apparatus of claim 38 wherein the controller unit synchronously commands a laser pulse during at least one period T.

42. The apparatus of claim 38 wherein the controller unit synchronously commands a laser pulse during at least one on state vector.

43. The apparatus of claim 42 wherein the control unit synchronously commands a laser pulse during at least one on state vector for 0.5 (T).

44. The apparatus of claim 42 wherein the control unit synchronously commands a laser pulse during at least one on state vector for less than 0.5 (T).

45. The apparatus of claim 42 wherein the control unit synchronously commands a laser pulse during at least one on state vector for greater than 0.5 (T).

46. The apparatus of claim 38 wherein the controller unit synchronously applies a laser pulse during at least one transition between an on state vector and the preceding off state.

47. The apparatus of claim 38 wherein the control unit directs the frequency f be increased synchronously while the laser is off and returned to f synchronously with commanding the laser source activate the laser.

48. The apparatus of claim 38 wherein the control unit directs a binary search of the test pattern by directing the laser be activated during various combinations of on state vectors.

* * * * *

UNITED STATES PATENT AND TRADEMARK OFFICE
CERTIFICATE OF CORRECTION

PATENT NO. : 6,967,491 B2  
DATED : November 22, 2005  
INVENTOR(S) : Philippe Perdu et al.

It is certified that error appears in the above-identified patent and that said Letters Patent is hereby corrected as shown below:

Title page,
Item [56], References Cited, OTHER PUBLICATIONS, delete
"Bruce et al., "Soft Defect Localization (SDL) on ICs", Proceedings From the 28$^{th}$ International Symposium for Testing and Failure Analysis (ISTFA), pp. 21-27, Nov. 3-7, 2002" (first occurrence); and insert
-- Cole Jr. et al., "Resistive Interconnection Localization", International Symposium for Testing & Failure Analysis (ISTFA), pp. 43-50, Nov. 2001 --.

Signed and Sealed this

Seventh Day of February, 2006

JON W. DUDAS
*Director of the United States Patent and Trademark Office*